United States Patent [19]

Gerber et al.

[11] Patent Number: 4,532,535
[45] Date of Patent: Jul. 30, 1985

[54] ELECTRICALLY REPROGRAMMABLE NON VOLATILE MEMORY CELL FLOATING GATE EEPROM WITH TUNNELING TO SUBSTRATE REGION

[75] Inventors: Bernard Gerber; Jean Fellrath, both of Neuchatel, Switzerland

[73] Assignee: Centre Electronique Horologer, S.A., Neuchatel, Switzerland

[21] Appl. No.: 408,275

[22] Filed: Aug. 16, 1982

Related U.S. Application Data

[63] Continuation of Ser. No. 129,324, Mar. 11, 1980, abandoned.

[30] Foreign Application Priority Data

Mar. 14, 1979 [CH] Switzerland ................. 2404/79

[51] Int. Cl.³ .............. H01L 29/78; H01L 27/04; G11C 11/40
[52] U.S. Cl. ............................ 357/23.5; 357/42; 357/89; 357/6; 365/185
[58] Field of Search .............. 365/185; 357/23 VT, 357/41, 59, 89, 42, 6

[56] References Cited

U.S. PATENT DOCUMENTS

| | | | |
|---|---|---|---|
| 3,919,711 | 11/1975 | Chou | 357/23 VT |
| 4,087,795 | 5/1978 | Roessler | 357/23 VT |
| 4,099,196 | 7/1978 | Simko | 357/23 VT |
| 4,148,044 | 4/1979 | Roessler | 357/23 VT |
| 4,257,056 | 3/1981 | Shum | 357/23 VT |

OTHER PUBLICATIONS

IEEE J. Solid State Circuits, vol. SC9, No. 3, Jun. 1974, pp. 103–110.

*Primary Examiner*—William D. Larkins
*Attorney, Agent, or Firm*—Cushman, Darby & Cushman

[57] ABSTRACT

An electrically erasable and reprogrammable non volatile memory cell is disclosed which is implemented in CMOS polycrystalline silicon gate transistor technology and comprises a p-channel MOS transistor the gate of which forms a first portion of a floating electrode. A second portion of said floating electrode has a substantially larger surface than the two other portions and is placed on a field oxide layer. A third portion of the floating electrode is placed on an injection oxide layer which is thinner than the gate oxide layer of the transistor. A $p^-$-doped well is formed under said third portion and is connected electrically to a write control electrode. An erase control electrode is arranged opposite the second portion of the floating electrode. The disclosed memory cell can be erased and reprogrammed through relatively low control voltages of a single polarity and these processes lead only to very small current consumption. The control voltages can thus be produced by means of a voltage multiplier which can be integrated on the same substrate and be controlled by a battery constituting the voltage supply source of the memory.

2 Claims, 7 Drawing Figures

ELECTRICALLY REPROGRAMMABLE NON VOLATILE MEMORY CELL FLOATING GATE EEPROM WITH TUNNELING TO SUBSTRATE REGION

This is a continuation of application Ser. No. 129,324 filed Mar. 11, 1980, now abandoned.

FIELD AND BACKGROUND OF THE INVENTION

The present invention relates to an electrically erasable and reprogrammable non volatile memory cell which is implemented in CMOS polycristalline silicon gate transistor technology and comprises a p-channel MOS transistor with floating gate.

Memories with long-term retentivity using a floating gate capacitively coupled to a control electrode are already known. The following references can be mentioned in this connection:

(1) Y. Tarui, Y. Hayashi and K. Nagai, "Electrically reprogrammable non volatile semiconductor memory", IEEE J. Solid-State Circuits, Vol. SC-7, pp. 369–375, 1972.

(2) H. Iizuka, F. Masuoka. T. Sato and M. Ishikawa, "Electrically Alterable Avalanche-Injection-Type MOS READ-ONLY Memory with Stacked-Gate Structure", IEEE Trans. on Electron Devices, Vol. ED-23, pp. 379–387, 1976.

(3) B. Agusta and J. J. Chang, "Non volatile semiconductor storage device utilizing avalanche-injection and extraction of stored information", U.S. Pat. No. 3,797,000.

(4) J. F. Verwey and R. P. Kramer, "ATMOS-An Electrically reprogrammable Read-Only Memory Device", IEEE Trans. on Electron Devices, Vol. ED-21, No. 10, pp.631–636, 1974.

(5) J. W. Kelley and D. F. Millet, "An electrically alterable ROM and it doesn't use nitride", Electronics, Dec. 9, pp.101.104, 1976.

(6) B. Rössler, "Electrically Erasable and Reprogrammable Read-Only Memory using the n-channel SIMOS One-Transistor Cell", IEEE Trans. on Electron Devices, Vol. ED-24, No. 5, pp. 606–610, 1977.

(7) R. G. Müller, H. Nietsch, B. Rössler and E. Walter, "An 8192-Bit Electrically Alterable ROM Employing a One-Transistor Cell with Floating Gate", IEEE J. of Solid-State Circuits, Vol. SC-12, No. 5, 1977.

(8) W. M. Gosney, "DIFMOS-A floating gate electrically erasable non volatile semiconductor memory technology", IEEE Trans. on Electron Devices, Vol. ED-24, pp. 594–599, 1977.

The main processes used for writing and erasing are the following:

Electron avalanche injection from a p$^+$-n junction (references 1,2,3,5,8)

Hole avalanche injection from a n$^+$-p junction (references 1,4,5,8)

Electron injection from the channel of an n-channel transistor (references 1,6,7)

Electron injection by field emission from the floating gate towards the control electrode (reference 2) or towards the source or the channel of the transistor (references 6,7)

Avalanche electron injection from polycristalline silicon (reference 3).

The field emission process has been described in some detail in the following reference (9) M Lenzlinger and E. H. Snow, "Fowler-Nordheim tunneling into thermally grown SiO$_2$", J. Appl. Phys., Vol. 40, pp. 278–283, 1969.

Furthermore, it has been proposed to increase the capacitive coupling between the floating gate and the control electrode, cf. the following reference

(10) B. Rössler, "Feldeffekttransistor mit isoliertem, schwebenden Speichergate", Swiss Pat. No. 601 895.

In the known memory cells the processes of writing and erasing are in general such that either of them leads to high power consumption or requires high control voltages. The control signals must therefore be provided by external sources, i.e. sources which are not implemented on the same integrated circuit as the memory. The devices described in references 2 and 3 have the inconvenience of requiring writing and erasing voltages of opposite signs which are thus difficult to commute to the various electrodes. The selective writing is often performed by superposition of two control voltages of opposite sign. The erasing is generally a global process and not a selective one. Finally, the known memories are generally not compatible with a standard polycristalline silicon gate CMOS technology.

OBJECTS AND SUMMARY OF THE INVENTION

A main object of the present invention is to provide a memory cell of the type mentioned at the beginning which is reprogrammable by means of a voltage obtained from the supply voltage of the memory itself. More particularly, an object is to allow the use of a voltage generated on the same integrated circuit as the memory and having a single polarity, for erasing and programming the memory through selection circuits which are also integrated on the same circuit and are fed and controlled from the same supply voltage as the memory.

The memory cell according to the invention comprises a p-channel MOS transistor having a floating gate placed on a gate oxide layer, said gate forming a first portion of a floating electrode, a second portion of said floating electrode having a surface substantially larger than that of said gate and being placed on a field oxide layer of substantially greater thickness than that of said gate oxide layer, a third portion of said floating electrode having a surface substantially similar to that of said first portion and being placed on an injection oxide layer of smaller thickness than that of said gate oxide layer, A p$^-$-doped well is formed in the substrate under said third portion of the floating electrode and is connected through a p$^+$-doped region to a write control electrode, an erase control electrode being arranged in facing relationship to said second portion of the floating electrode and being separated therefrom by at least one insulating oxide layer. The arrangement provides a capacitance between the erase control electrode and said second portion of the floating electrode which is greater than the capacitance between said floating electrode and the substrate or said p$^-$-doped well. According to another embodiment a p$^+$-doped region is formed in the substrate near said injection oxide layer and is connected to the written control electrode.

The memory cell according to the invention has the important advantage to be erasable and reprogrammable by relatively low control voltages and at extremely small currents. The necessary erase and write voltages can therefore be generated from the power supply of the circuit by means of voltage multipliers fully integrated on the same substrate as the memory. The control voltages can have a single polarity, in particular negative polarity, in accordance with the CMOS technology described for instance in the following reference

(11) B. Gerber and F. Leuenberger, "Circuit à transistors MOS complémentaires et son procédé de fabrication", Swiss Pat. No. 542 518.

Selection circuits which are controlled by low voltages allow to selectively apply the generated control voltages to the corresponding electrodes of the desired memory cell. The reference

(12) J. Fellrath and E. Vittoz, "Steuervorrichtung in integrierter Schaltungstechnik", U.S. patent application Ser. No. 919,320 filed June 26, 1979 describes a voltage multiplier and selection circuits which can be used for controlling the memory cell according to the invention.

The invention also relates to a fully integrated memory device making use of the above mentioned memory cell.

BRIEF DESCRIPTION OF THE DRAWINGS

FIG. 3.$b$ is a sectional view of a variant of the embodiment of FIGS. 2 and 3.$a$.

DETAILED DESCRIPTION OF THE INVENTION

Figure 1:
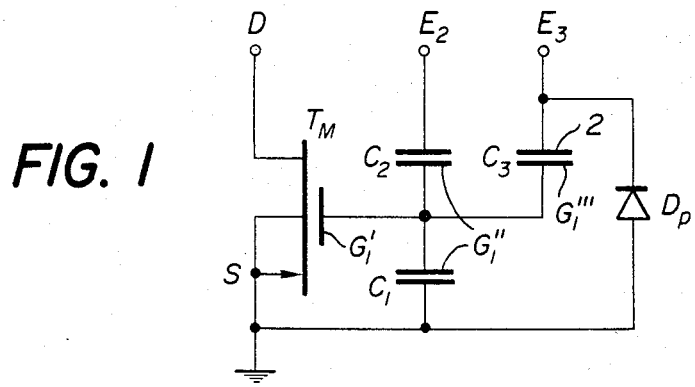
FIG. 1 is an electric circuit diagram showing the equivalent circuit of a memory cell according to the invention.
Figure 2:
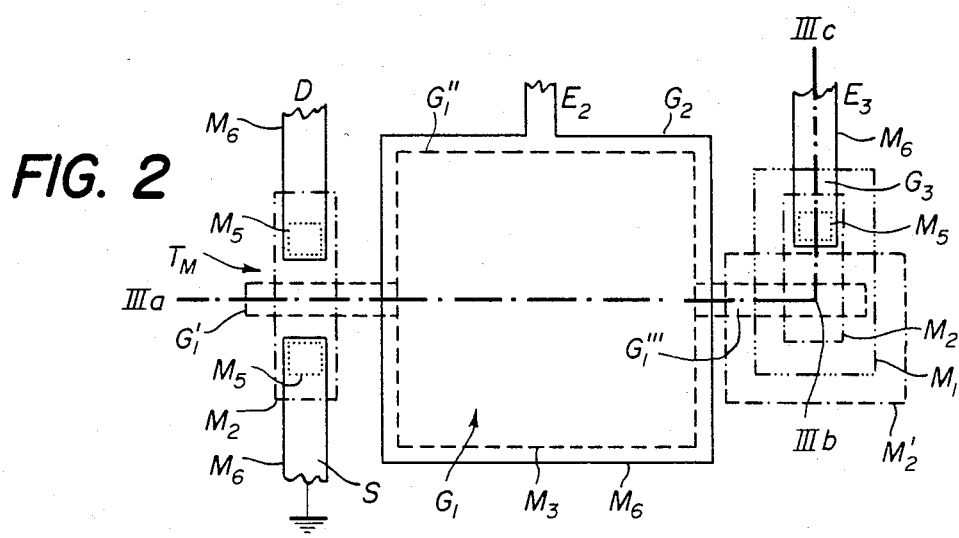
FIG. 2 is a top view of a first embodiment of a memory cell of the invention also representing the mask arrangement of the corresponding integrated circuit.
Figure 3A:
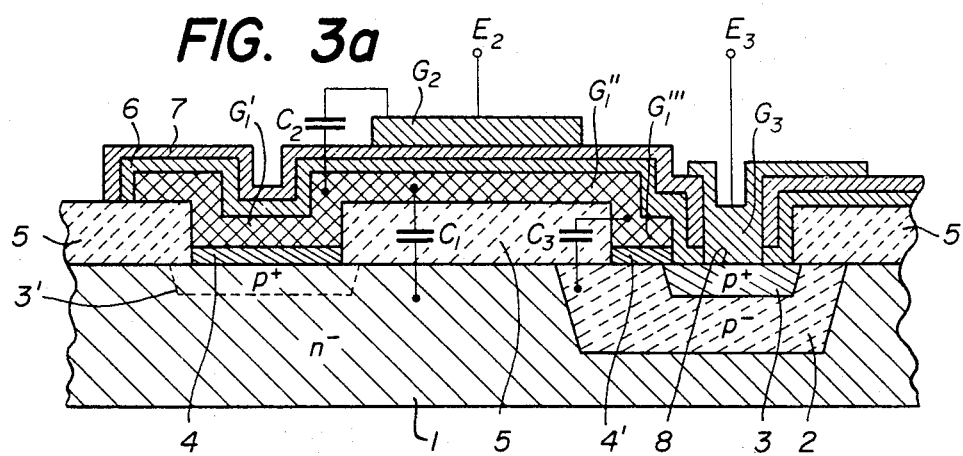
FIG. 3.$a$ is a sectional view along line IIIa–IIIc of FIG. 2.
Figure 3B:
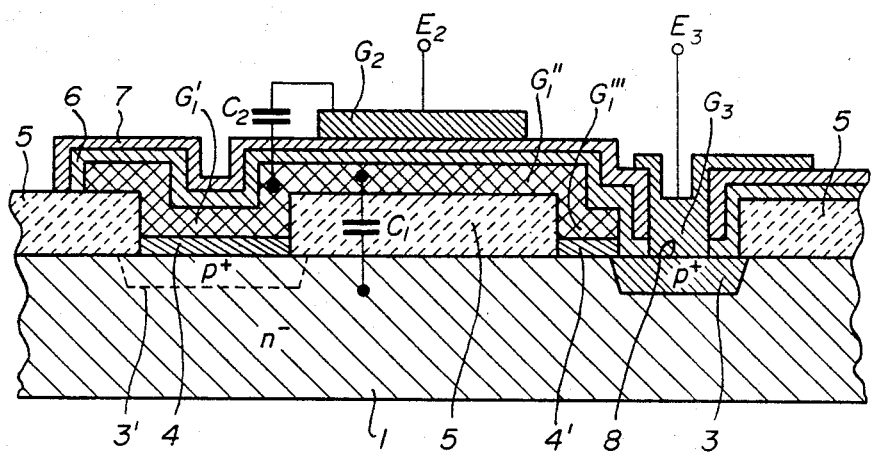

Referring to the memory cell shown in FIGS. 2 and 3.$a$ which corresponds to the equivalent electric circuit diagram of FIG. 1, a p-channel transistor $T_M$ has a floating gate $G_1'$ which forms a first portion of a floating electrode $G_1$. A second portion $G_1''$ of the floating electrode $G_1$ is capacitively coupled to a control electrode $G_2$ and a third portion $G_1'''$ of the floating electrode $G_1$ is capacitively coupled to a slightly $p^-$-doped well 2 which is formed in a substrate 1, said substrate being a monocristalline silicon wafer of $n^-$-type. The p-n junction between said well and said substrate constitute a diode $D_p$ which is represented in the circuit diagram of FIG. 1.

The external connections of this arrangement are designated by D for the drain of transistor $T_M$, $E_2$ for the connection of the control electrode $G_2$ and $E_3$ for the connection of well 2, which latter connection is made through a $p^+$-doped region 3 formed inside well 2 and placed in contact with a metallized part $G_3$. The substrate 1 representing the source electrode S of transistor $T_M$ is connected to ground.

As shown more particularly in FIGS. 2 and 3.$a$, gate $G_1'$ of transistor $T_M$ is separated from the substrate by a gate oxide layer 4 the thickness of which has the usual value for a transistor, for instance in the present example 750 Å. Portion $G_1''$ of the floating electrode $G_1$ is separated from the substrate by a field oxide layer 5, the thickness of which is about 10,000 Å. The third portion $G_1'''$ of the floating electrode is separated from the surface of well 2 by a layer of gate oxide 4' which is thinner than layer 4 and has for instance a thickness of 350 Å. This layer 4' is called injection oxide layer for the purpose of this description.

As shown in FIG. 3.$a$, the floating electrode $G_1$ of polycristalline silicon is covered by a first layer 6 of boron doped silicon oxide and by a second layer 7 of phosphorus doped silicon oxide. The control electrode $G_2$ is made of aluminum and realized by metallization in the same way as the other electrical connections of the cell.

FIG. 2 shows the arrangement of the different parts of the memory cell in top view and represents the mask arrangement that can be used for the manufacture of the circuit.

The manufacturing process used in the present invention is based on the CMOS technology such as described for instance in reference (11). With respect to this technology, which uses masks designated by $M_1$ through $M_6$, an additional mask $M_2'$ is necessary for implementing the present circuit.

A first mask $M_1$ is used to define the region of the substrate in which the slightly $p^-$-doped well 2 is being formed, as well as possible other wells which might be needed on the same substrate to form n-channel transistors of the whole memory arrangement.

Mask $M_2$ defines the windows encircling the source, drain and gate (3') regions of transistor $T_M$, as well as the region 3 which is in electric contact with well 2. The corresponding regions of the other p-channel transistors which can be part of the whole circuit implemented on the same substrate, are obtained by means of the same mask.

The mask designated $M_2'$ allows one to etch the gate oxide layer 4 in region 4' after a partial growth. The growth of the gate oxide is then continued until the desired thickness of 750 Å is obtained in region 4. Thanks to the additional mask $M_2'$ the injection oxide layer 4' therefore has a reduced thickness which is essential for the operation of the present memory cell as described hereafter.

Mask $M_3$ allows one to define the floating polycristalline silicon electrode as well as the gates of possible other p- and n-channel transistors realized on the same substrate. It is to be noted that the floating electrode is placed on a gate oxide layer of reduced thickness in the region defined by $M_2$ and $M_2'$, that it is placed on a gate oxide layer of usual thickness in the region defined by $M_2$ alone and on a field oxide layer anywhere else.

Mask $M_4$ is not shown in FIG. 2, as it is used in the mentioned CMOS technology to define the regions to be doped $n^+$ and $p^+$ respectively during the manufacturing process. In the case of FIG. 2 this mask therefore does not define any limited region, the whole surface shown being doped $p^+$. Generally, however, $p^+$ and $n^+$ diffusions are made simultaneously. The regions which are to be doped $n^+$ are covered by a single layer of phosphorus doped oxide while the other regions are covered by boron doped and phosphorus doped layers. In the case of FIG. 3, region 3 is doped $p^+$ to realize an electric contact with the $p^-$-doped well 2. Mask $M_4$ will be seen in FIG. 4 which represents an embodiment in which a $n^+$-doping is being made in the shown part of the circuit, as will be described in connection with the embodiment of FIG. 4.

The next mask is designated M₅ and allows to open the contact windows such as 8 in FIG. 3.a through the doped oxide layers to allow contacting of the p+- and n+-doped regions. It is to be noted that the polycristalline electrode G₁ is not bared by any contact windows but is entirely incorporated in oxide thus forming a floating electrode.

The last mask M₆ defines the metallic portions, in particular the connecting portions, by etching a previously deposited aluminum layer. In the case of FIG. 2 the control electrode G₂ as well as the connections D, E₂, E₃ and S are realized in the same step.

In FIG. 3.a, the capacitances considered in the corresponding diagram of FIG. 1 have been shown to facilitate the understanding. Capacitance $C_1$ is the capacitance between the floating gate G₁ and the substance through the field oxide layer 5 and the gate oxide layer 4, capacitance $C_2$ is the capacitance between the floating gate G₁ and the control electrode G₂, and capacitance $C_3$ is the capacitance between the portion $G_1'''$ and well 2 through the injection oxide layer 4' and the field oxide layer 5 placed on well 2.

The arrangement is such that capacitance $C_2$ is large with respect to $C_1$ and $C_3$ in order to provide on the floating electrode a voltage $U_{G1}$ which is as close as possible to the control voltage $U_{G2}$ applied at E₂, both voltages being linked by the relationship $$U_{G1} = \frac{C_2}{C_2 + C_1 + C_3} \cdot U_{G2}$$

This is obtained by giving the portion $G_1''$ of the floating electrode G₁ and a substantially greater surface than the surface of gate $G_1'$ of transistor $T_M$ (which is, for instance, 6×6 μm²) and a substantially greater surface than that of portion $G_1'''$ of the floating electrode. It is to be noted that for a given surface $G_1''$ the capacitance $C_2$ can be increased by n+-doping the part $G_1''$ of the floating electrode, which can be realized by applying a single layer of phosphorus doped oxide between G₂ and $G_1''$. Capacitance $C_3$ is made small with respect to the other capacitances so that the voltage applied to well 2 appears substantially undiminished behind the thin injection oxide layer 4' (thickness about 350 Å), the voltage between electrode G₁ and well 2 being $$U_{G1} = \frac{C_3}{C_1 + C_2 + C_3} \cdot U_{G3}$$

The operation of the memory cell as shown in FIGS. 1 to 3.a can be described as follows.

In the initial state the floating electrode is not charged and transistor $T_M$ is not conductive when a supply voltage of −1.5 V is applied to its drain.

When a negative control voltage of about −40 V is applied to connection E₂, the floating electrode is negatively biased by capacitive coupling and therefore an electric field is built up through the thin injection oxide layer 4' which field has a sufficient strength to generate field emission of electrons towards well 2, well 2 being connected to ground through region 3, G₃ and E₃. Transistor $T_M$ therfore remains non-conductive.

If the characteristic describing the drain current $I_D$ of transistor $T_M$ as a function of the negative voltage $U_{G2}$ applied on the control electrode at a drain voltage of −30 mV is considered, the extrapolation of the linear part of that characteristic through $I_D=0$ defines the extrapolated threshold voltage of the memory cell with respect to the floating electrode.

If a negative voltage of −40 V is applied to control electrode G₃ (through connection E₃), terminal E₂ being connected to ground, the potential of the floating electrode is practically determined by that of electrode G₂ and the electric field through the injection oxide layer 4' will have the opposite direction with respect to the just described situation by which erasing of the cell was obtained. Presently electrons are therefore emitted by the well 2 towards the floating electrode by the process of field emission, and electrode G₁ will be charged negatively. Transistor $T_M$ becomes conductive even for a voltage $U_{G2}=0$ V. The threshold voltage of the cell in the thus programmed state can be determined in the same way as for the erased memory by using this time a positive voltage $U_{G2}$.

The present memory cell thus uses electron injection by field emission for performing erasing as well as writing of the memory. In both cases this emission requires only very little power and control voltages of the same polarity (in particular negative polarity).

It is to be noted that the electrical fields applied through the thin injection oxide layer 4' are close to the breakdown value of the oxide layer. However, the electron flow limits itself automatically, as the floating electrode is being charged when the current begins to flow, so that the field applied through the oxide layer diminishes and stops the injection. As the control electrode G₂ is entirely insulated and well 2 has a breakdown voltage of about 200 V, no other currents than the mentioned injection currents are produced.

The writing and erasing processes used in the present memory cell do not require a particular shape of the voltage to be applied. Another important advantage is the fact that the substrate is always at the same potential. A memory cell can thus be programmed or erased selectively while the remaining circuit which is integrated on the same substrate, continues to operate.

According to a variant shown in FIG. 3.b of the embodiment of FIGS. 2 and 3.a, the p⁻-doped well 2 of this cell is left out. In this case writing is obtained by avalanching the p+-n junction rather than by field emission. This process also requires a negative voltage. The use of the said p+-n junction and the arrangement thereof under a gate oxide layer of reduced thickness has two main advantages with respect to the avalanche mechanism used previously (according to reference 2) where the drain of the MOS transistor is used for the injection. When the floating electrode is being negatively charged, no stray current appears between the injection diode and the source of transistor $T_M$. It is therefore not necessary to have the source of the memory cell floating during writing by means of an additional logic circuit. Furthermore, the avalanche voltage of the junction is reduced (to about 20 V for a thickness of layer 4' of 350 Å) and therefore that voltage can be easily switched by means of transistors implemented on a usual gate oxide layer, without the presence of breakdown currents. In practice, it appears that with pulses of relatively slow rise time (200 ms) the avalanche currents obtained remain smaller than 50 nA and are thus compatible with a fully integrated voltage multiplier.

Figure 4:
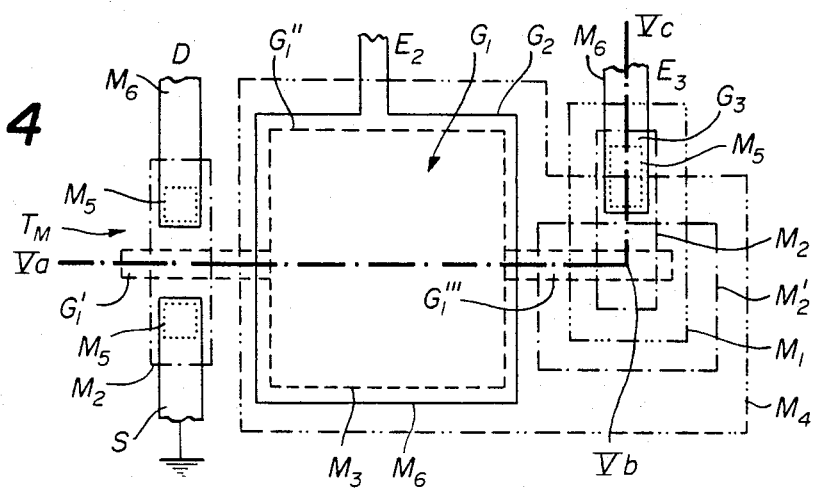
FIG. 4 is a top view similar to that of FIG. 2 of another embodiment of the memory cell according to the invention.
Figure 5:
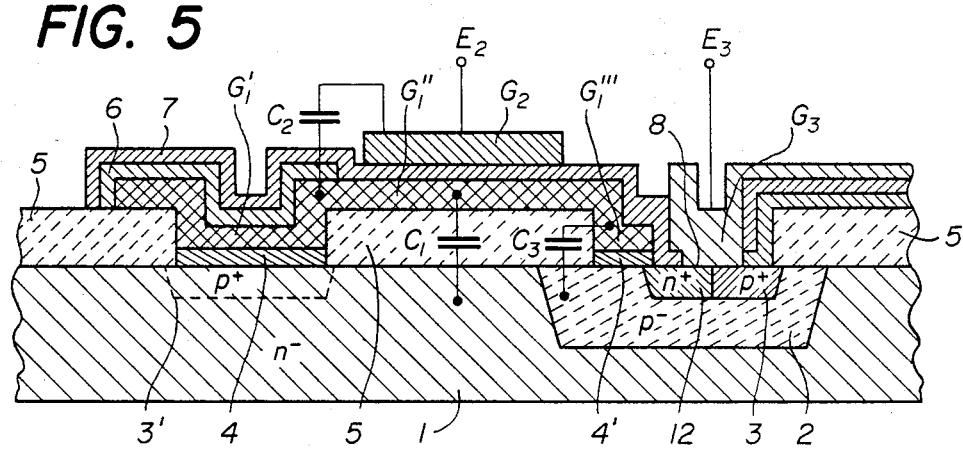
FIG. 5 is a sectional view along the Va–Vc of FIG. 4.

FIGS. 4 and 5 show another embodiment of the memory cell which is similar to that of FIGS. 2 and 3 and only differs therefrom in two points as mentioned hereafter. Accordingly, in all other respects the description is similar to that already given and will not be repeated for this embodiment, in which the same reference numerals are used to designate analog elements with respect to FIGS. 2 and 3.

In the embodiment of FIGS. 4 and 5, the floating electrode $G_1$ is doped n+ in place of p+ in the portions $G_1''$ and $G_1'''$. This embodiment does not require an additional manufacturing step. The capacitive coupling between control electrode $G_2$ and floating electrode $G_1$ is increased due to the fact that a single oxide layer which is phosphorus doped is placed between these two electrodes and therefore their distance is reduced. Furthermore, the potential barrier between the $n^-$-doped polycristalline silicon and the gate oxide 4' is smaller and therefore the electrons in major concentration in the floating electrode are reinjected by smaller erasing voltages, which voltages can be of about 5 to 10 V depending on the pulse duration. FIG. 4 shows the border line of mask $M_4$ which is used to define the n+-doped regions (inside the border line) and the p+-doped regions.

The second feature which characterizes the embodiment according to FIGS. 4 and 5 is the fact that a n+-doped region 12 is formed in the well 2, which region 12 is partially situated under the injection oxide layer 4' of reduced thickness. Said doped region 12 obtained by lateral diffusion also results in a reduction of the potential barrier mentioned before and thus reduces the required write voltage.

The present memory cell has been designed to be capable of being erased and programmed by means of voltages derived from the supply source of the memory cell itself through circuits which can be fully integrated and implemented on the same substrate as the memory.

Figure 6:
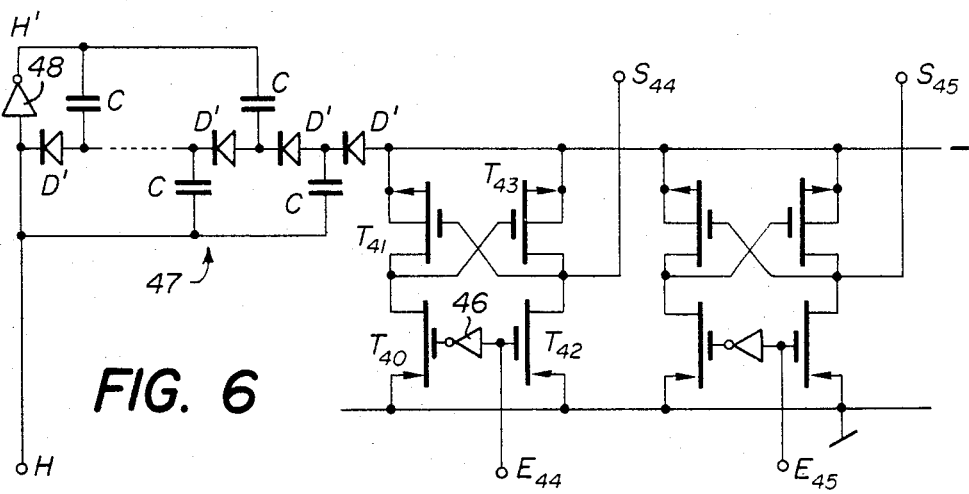
FIG. 6 is the circuit diagram of a voltage multiplier and associated selection circuit which can be used in relation with the memory cell of the invention.

A memory device making use of memory cells comprises an oscillator providing high frequency pulses, a voltage multiplier and selection circuits for the control of the memory. An example of a voltage multiplier and associated selection circuits is described in detail in reference (12). FIG. 6 shows the corresponding electric circuit diagram in which a fully integrated voltage multiplier 47 comprises storage capacitors C and diodes D' connected as shown to provide on a line (−) a negative voltage which can readily reach the level necessary for controlling a memory cell as described above. It is to be noted that the silicon gate CMOS transistor technology allows a particularly advantageous realization of this voltage multiplier by using in particular floating polycristalline silicon diodes and by realizing the storage capacitances C by connecting in parallel the capacitances of polycristalline silicon to well on gate oxide and of polycristalline silicon to metal.

The voltage multiplier is controlled at H by high frequency pulses which appear with opposite polarity at the output H' of an inverter 48.

The negative voltage at the output of the voltage multiplier 47 is applied to two selection circuit comprising each two pairs of transistors such as $T_{40}$, $T_{41}$ and $T_{42}$, $T_{43}$ as well as an inverter 46. Low voltage control signals are applied at $E_{44}$ or $E_{45}$ to these selection circuits which are associated to control electrodes $E_2$ and $E_3$, respectively, of the memory cells of the arrangement.

When a negative potential is applied for instance at $E_{44}$, transistors $T_{42}$ and $T_{41}$ are conductive while $T_{40}$ and $T_{43}$ are shut-off. When a positive potential is applied at $E_{44}$ transistor $T_{42}$ and $T_{41}$ are shut-off, $T_{40}$ and $T_{43}$ are in the conductive state and the high voltage of the multiplier appears at output $S_{44}$. During the switching process the high voltage decreases to the point where the circuit switches from one stable state to the other and increases thereafter with a time constant which is determined by the circuit elements and the frequency of the pulses applied at H. As the voltage multiplier has a high internal resistance the operation of the selection circuits is guaranteed for transistors of very small dimensions.

The design of the present memory cell perfectly fulfills to the conditions required by an integrated control circuit such as shown in FIG. 6. As already stated, the memory cell needs very low write and erase power such as it is available at the output of a voltage multiplier. Furthermore, the necessary control voltages are below the limit corresponding to the breakdown voltages of the storage capacitors of the voltage multiplier and by the breakdown voltage of the transistors of the selection circuits. The control voltages are of the same polarity for erasing the memory and for writing. Finally, the shape of the control voltage available at the output of the voltage multiplier is readily usable for the memory cell according to the invention, the durations of writing and erasing being as a consequence, relatively long (about 250 ms).

The memory cell of the invention is particularly useful for the realization of memories of small capacity but very long duration of information retention. It can for instance be used to allow selecting various optional characteristic of a finished circuit or digital regulating of certain critical parameters such as resistance, capacitance, drain current, occurring in analog circuits.

I claim:

1. An electrically erasable and reprogrammable non volatile memory cell implemented in CMOS polycrystalline silicon gate transistor technology comprising a p-channel MOS transistor and a floating electrode, said MOS transistor having a floating gate placed on a gate oxide layer, said gate forming a first portion of said floating electrode, a second portion of said floating electrode having a surface substantially larger than that of said gate and being placed on a field oxide layer of substantially greater thickness than that of said gate oxide layer, a third portion of said floating electrode being separated from said p-channel MOS transistor having a surface substantially similar to that of said first portion and being placed on an injection oxide layer of smaller thickness than that of said gate oxide layer, a p-doped well being formed in the substrate under said third portion of the floating electrode and being connected through a p+-doped region to write-control electrode, an erase control electrode being arranged in facing relationship to said second portion of the floating electrode and being separated therefrom by at least one insulating oxide layer, the arrangement providing a capacitance between the erase control electrode and said second portion of the floating electrode which is greater than the capacitance between said floating electrode and the substrate or said $p^-$-doped well, and wherein said second portion of the floating electrode is made of n+-doped polycristalline silicon, and wherein an n+-doped region is formed in said $p^-$-doped well, said $n^-$-doped region overlapping in part said injection oxide layer and contacting said p+-doped region connected to said write control electrode whereby said floating gate may be negatively charged or discharged by the application of an appropriate voltage between said erase- and write-control electrode to cause a Fowler-Nordheim tunneling current to flow through said injection oxide layer between said $p^-$ doped well and said third portion of said floating electrode.

2. An electrically erasable and reprogrammable non volatile memory cell implemented in CMOS polycristalline silicon gate transistor technology comprising a p-channel MOS transistor having a floating gate placed on a gate oxide layer, said gate forming a first portion of a floating electrode, a second portion of said floating electrode having a surface substantially larger than that of said gate and being placed on a field oxide layer of substantially greater thickness than that of said gate oxide layer, a third portion of said floating electrode having a surface substantially similar to that of said first portion and being placed on an injection oxide layer of smaller thickness than that of said gate oxide layer, a p-doped well being formed in the substrate under said third portion of the floating electrode and being connected through a $p^+$-doped region to a write-control electrode, an erase control electrode being arranged in facing relationship to said second portion of the floating electrode and being separated therefrom by at least one insulating oxide layer, the arrangement providing a capacitance between the erase control electrode and said second portion of the floating electrode which is greater than the capacitance between said floating electrode and the substrate or said $p^-$-doped well, and wherein an $n^+$-doped region is formed in said $p^-$-doped well, said $n^+$-doped region overlapping in part said injection oxide layer and contacting said $p^+$-doped region connected to said write control electrode.

* * * * *